United States Patent [19]
Chao

[11] 4,344,002
[45] Aug. 10, 1982

[54] DETECTION CIRCUIT AND STRUCTURE THEREFOR
[75] Inventor: Robert L. Chao, Sunnyvale, Calif.
[73] Assignee: Supertex, Inc., Sunnyvale, Calif.
[21] Appl. No.: 93,516
[22] Filed: Nov. 13, 1979

Related U.S. Application Data

[62] Division of Ser. No. 880,035, Feb. 22, 1978, Pat. No. 4,215,281.

[51] Int. Cl.³ .............................................. H03K 5/02
[52] U.S. Cl. .................................. 307/270; 307/304; 307/475
[58] Field of Search ................ 307/268, 270, 304, 475

[56] References Cited
U.S. PATENT DOCUMENTS 3,378,783 4/1968 Gibson ................................ 307/270
3,937,983 2/1976 Reed .................................. 307/270
4,063,117 12/1977 Laugesen et al. .................. 307/270

Primary Examiner—John Zazworsky
Attorney, Agent, or Firm—Harry M. Weiss

[57] ABSTRACT

A detection circuit particularly adapted as a smoke detector employs a minimum number of components by a CMOS integrated circuit which receives directly the output of a smoke detector on one of the inputs of an input comparator circuit which provides static input protection and a high input impedance by employing thick oxide layer over the gates of the comparator transistors. The CMOS chip also directly supplies operating current for a mechanical or piezoelectric horn. Further features include a clocked low voltage alarm; a buffer stage to permit the interconnection of a number of different detector circuits in common to a single input-/output lead; and a visual LED indicator to indicate that the circuit is operating and to provide a visual indication any time the alarm condition for the circuit has been actuated.

3 Claims, 5 Drawing Figures

DETECTION CIRCUIT AND STRUCTURE THEREFOR

This is a division, of application Ser. No. 880,035 filed Feb. 22, 1978 now U.S. Pat. No. 4,215,281 which issued on July 29, 1980.

BACKGROUND OF THE INVENTION

A large number of applications exist for alarm circuits which employ a detector of some type to detect the condition for which an alarm is to be activated. This detector then is coupled with a switching and driving circuit to turn on an audible or visual alarm whenever the alarm condition is detected by the system. In its simplest form, such alarm circuits merely comprise a mechanical or electrical switch which is closed upon sensing the alarm condition to complete a circuit to a bell, horn or visual alarm in the form of a light or other device. Alarms of this type are commonly used as burglar alarms to detect the unauthorized entry into a premises when the alarm system has been activated, such as when the premises are normally vacated.

Some applications, however, have arisen which require alarm interface circuits between the sensing device which senses the alarm condition and the audible or visual output which indicates that the alarm condition has been sent. Among these applications are smoke detector alarm circuits which employ either an ionization chamber device or a photoelectric device to detect the presence of smoke and therefore activate the alarm condition. The ionization chamber smoke detectors are popular and require a very high impedance load in order to properly operate, because of the inherent characteristics of the smoke detector device itself. In the past, discrete transistor switching circuits have been used as interface switching amplifiers between the smoke detector and the audible or visual alarm to be driven upon detection of the smoke by the detector.

The use of discrete circuit components, however, is relatively costly and requires more labor than if integrated circuit technology were used. It has been difficult to obtain the desired low current leakage on the output lead from the ionization chamber of the smoke detector, since conventional integrated circuit technology does not provide the necessary high impedance input which is necessary to successful operation of such a circuit.

It is desirable, however, to provide an integrated driver circuit capable of interfacing between a smoke detector, of either the ionization type or photoelectric type, and an output horn, either of the mechanical type of a piezoelectric horn, without any buffer stages between the integrated circuit and either its input from the smoke detector or its output to the horn which it is driving.

SUMMARY OF THE INVENTION

Accordingly, it is an object of this invention to provide an improved detection circuit.

It is an additional object of this invention to provide an improved detection circuit having a high input impedance and good static input protection for the circuit.

It is another object of this invention to provide an improved CMOS detection circuit.

It is a further object of this invention to provide an improved alarm detection circuit for interfacing between a detector of an alarm condition and an alarm.

It is yet another object of this invention to provide an improved alarm detection circuit which is capable of being interconnected with other similar circuits on a common bus for activating all of the circuits in the event any one of them detects an alarm condition.

It is a still further object of this invention to provide an improved CMOS circuit structure which is readily adaptable for utilization with input signal sources requiring a high input impedance.

In accordance with a preferred embodiment of this invention, a CMOS circuit is constructed with the input transistors having a thicker gate oxide than other transistors used internally in the circuit to present a high input impedance to input devices requiring such an impedance, while at the same time providing good static input protection to the circuit. The CMOS circuit also provides sufficient current from its output stage to directly drive a mechanical or piezoelectric horn or other type of alarm without requiring any additional output buffer stages. A provision is made in the circuit for sensing the drop in the DC supply voltage of the battery operating the circuit and for actuating the alarm output of the circuit at pulsed intervals whenever the battery voltage falls below some pre-established safe level. In addition, a buffer section is provided to interface with a common input/output bus which can be interconnected in common with a number of different detector circuits to activate the alarms of all of the detector circuits whenever the condition to be detected is sensed by any one of them.

Finally, to provide a user of the system with assurance that the system is operating properly, a visual indicator is periodically flashed on to show the proper functioning of the circuit; and whenever an alarm condition is sensed by the system, this visual indicator is continuously energized as well as the audible alarm.

DETAILED DESCRIPTION

Figure 1:
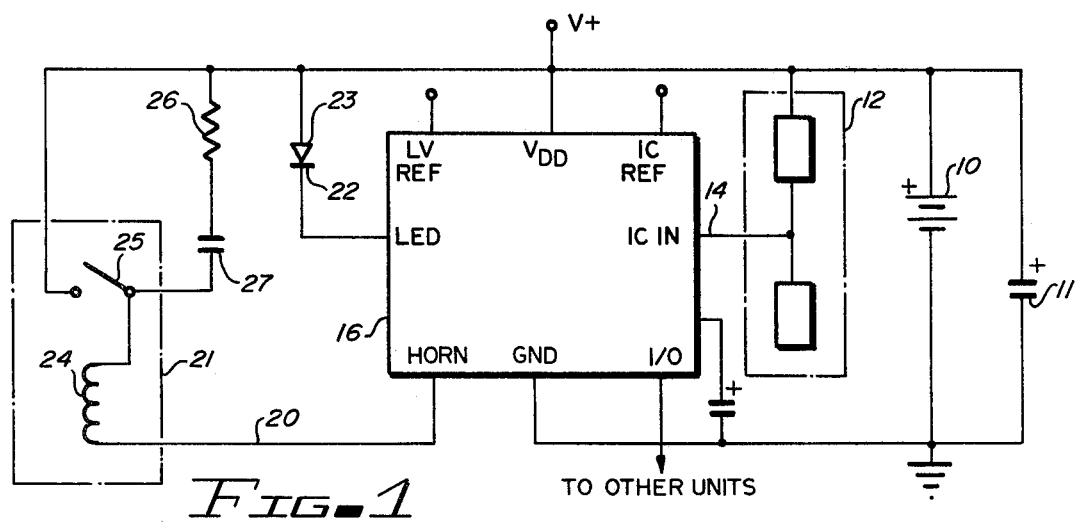
FIG. 1 is a block diagram of a typical installation of a detection circuit.

In the drawings, the same reference numbers are used throughout the several figures to designate the same or similar components.

Reference first should be made to FIG. 1, which shows a smoke detector installation using a preferred embodiment of the invention in a single CMOS chip for the detector circuit to interconnect the smoke detector and an alarm. A battery 10 is used to power the circuit since the alternating current power found in most homes and buildings often is interrupted by a fire, and the detector circuit would not operate unless a DC power source were provided. The battery 10 typically is a 9 volt or 12 volt battery depending on the operating characteristics of the system with which it is used. As shown in FIG. 1, this battery has a capacitor 11 connected in parallel with it; and an ionization type of smoke detector 12 is shown also connected across the battery terminals.

The smoke detector circuit 12 may be of any suitable conventional type and typically is an alpha particle radiation type detector although it could be a photo electric type as well. Such detectors commonly include a reference chamber (illustrated by the lower block inside the dotted lines 12) and an active or sensing chamber (indicated as the upper block within the dotted line configuration of the chamber 12). These two blocks, for normal non-alarm conditions are balanced, and produce a pre-established output voltage on an output lead 14 connected to the input "IC IN" of a CMOS smoke detector circuit 16.

Figure 3:
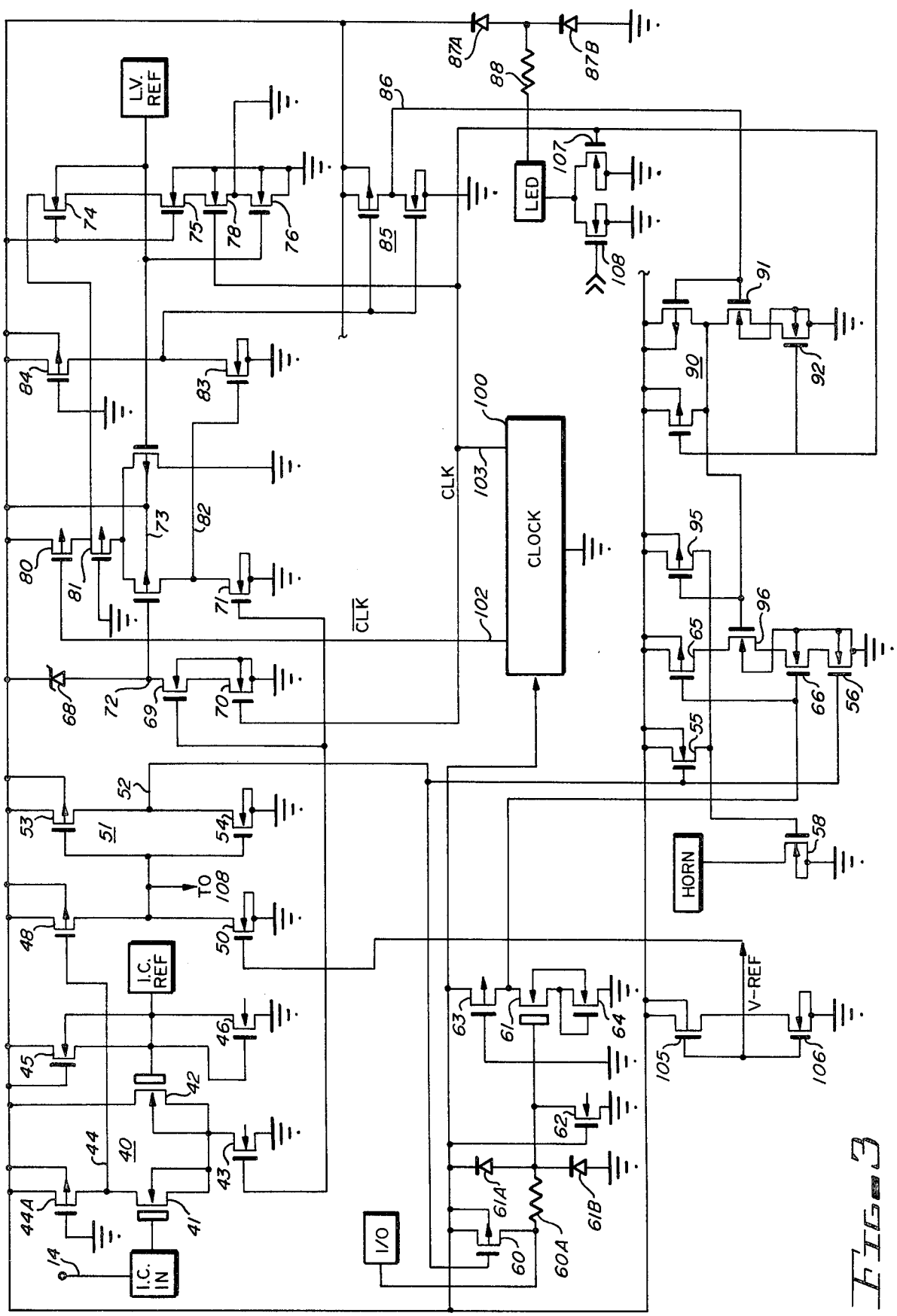
FIG. 3 is a detailed schematic diagram of the circuit of the integrated circuit chip represented in block form in FIG. 1.

The circuit 16 is a block diagram showing the inputs and outputs to the bonding pads on the circuit which is shown in detail in FIG. 3. Each of these inputs and outputs are identified on the block 16; and the function of these various inputs and outputs, and the manner in which they interrelate with one another in the operation of this circuit, is explained subsequently in conjunction with FIG. 3.

It should be noted in FIG. 1 that the alarm outputs from the circuit 16 comprise the output "HORN" on a lead 20 to the coil of a mechanical horn 21 and an output "LED" on a lead 22 to a LED diode 23. The horn circuit includes a relay coil 24 which closes a contact 25 in an operating circuit which has a resistance 26 and a series capacitance 27 in it. These are the electrical characteristics or components of what is typically known as a "mechanical horn" but the details of such a horn are not important to the operation of the invention, so they are not shown in FIG. 1.

As explained above, the circuit 16 is a CMOS integrated circuit. Typically, however, CMOS circuits do not present a high enough input impedance to interface directly with the output of the detector 12 supplied over the lead 14. As explained above, this detector output requires a very high impedance load with very low leakage current or the smoke detector unit will not properly operate.

Figure 2:
FIG. 2 is a cross-sectional representation of a portion of a CMOS chip.
Figure 2:
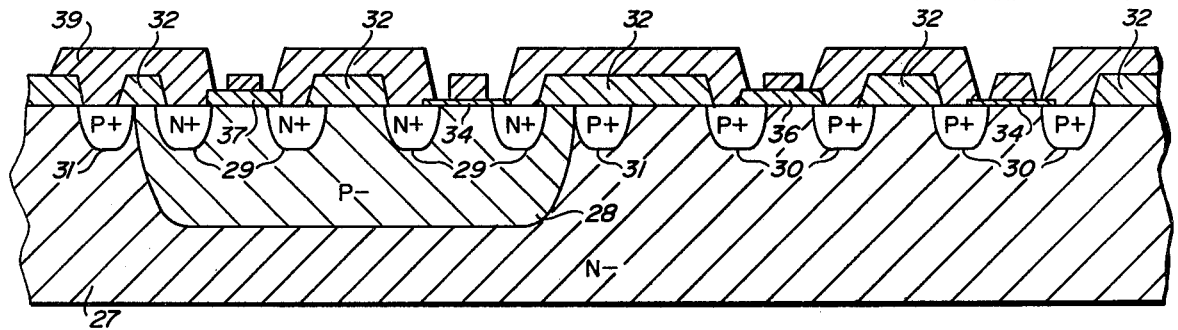

In order to overcome this disadvantage of conventional CMOS circuits and permit direct connection to the detector 12, the CMOS device is constructed in accordance with the structure shown in FIG. 2. As is typical with CMOS devices, the body or substrate 27 is comprised of n− doped material. For making the n channel FET transistors, a number of p− doped wells 28 are formed in the n− substrate; and the n channel transistors are formed by making n+ drain and source diffusions 29 in the wells 28. The p− channel transistors are formed by making p+ diffusions 30 in the n− substrate 27 in a conventional manner. A guard ring or isolation ring formed of a p+ diffusion 31 is formed around the p− wells 28 for purposes which are well known in the art.

After the various diffusions have been formed in the base or body substrate 27, a thick oxide layer 32, commonly referred to as field oxide, is deposited over the surface of the chip. Then in subsequent processing steps, part of this oxide coating or layer is etched or cut away over the source and drain diffusions 29 and 30 and over the channels of the transistors. Subsequently, a thin oxide coating or layer 34 is formed over the gates of the different transistors comprising the circuit which is formed on the chip for the purpose of supporting the metalization for the gates of these transistors. The thickness of the thin oxide layer 34 is typically of the order of one thousand angstroms, while the thickness of the field oxide layer 32 is of the order of ten thousand angstroms, an order of magnitude greater. The thin oxide layer 34 over the gates of the transistors is selected to provide the maximum gain per unit area of the chip which is consistent with the most efficient utilization of the chip area to obtain the desired electrical operating characteristics of the system formed on the integrated circuit chip.

The use of thin oxide layers, such as the one thousand angstrom thick layer 34, which are typically employed in CMOS circuits, however, provides static protection and sufficiently high input impedance to permit direct connection of any devices having such a thin gate oxide to the output of a smoke detector of the type shown in FIG. 1. To permit this to be accomplished, the gate oxide layers over selected ones of the transistors (and this may be for either n channel or p channel devices) are made two or three times as thick as the oxide layer 34. Two such thick gate oxide layers 37 and 38 are illustrated in FIG. 2. One of these (37) is shown for a n channel device and the other (38) is shown for p channel device. The processing steps necessary to form these additional thick gate oxide layers 37 and 38 are similar to those employed in forming the oxide layers 34 and 32, but obviously additional masking and oxidation steps are required in order to achieve the three different oxide thicknesses which result in the device shown in FIG. 2.

These oxide thicknesses comprise a thin layer (approximately one thousand angstroms) 34 over most of the gates of the transistors formed on the chip. An intermediate thickness oxide layer (37 and 38) which constitutes a thick oxide over the gates of some of the transistors in the order of two thousand to three thousand angstroms thick is the second such layer. The third and thickest layer is the conventional field oxide layer which, as stated above, is about ten thousand angstroms thick.

One other modification is done to some of the n channel devices in the structure of FIG. 2 and that is to electrically interconnect the n+ source diffusion of some of the devices in the p− wells with the p+ guard or isolation ring 31 formed around the wells. The reason for doing this is to maintain the threshold voltages of those devices in the p− wells 28 which are so connected at a constant level, irrespective of variations in the source voltage. The interconnection which is illustrated in FIG. 2 for one such p− well 28 is effected by extending the metalization 39 connected to the left-most n+ diffusion 29 through the field oxide layer 32 to the isolation ring 31. This results in improved operating characteristics of the circuit as will become apparent in the description of the operation of the detailed circuit shown in FIG. 3.

Reference now should be made to FIG. 3 in which various rectangular blocks are shown throughout the Figure with the same letter or word designations which appear in the block of FIG. 1 for the integrated circuit chip 16. These rectangular blocks in FIG. 3 correspond to the bonding pads which provide the outputs and inputs to the integrated circuit chip interconnected with the external circuitry shown in FIG. 1. The input to the CMOS circuit which is shown in FIG. 3 is applied over the lead 14 (which has been described previously) to the input bonding pad "IC IN". This bonding pad is connected to the gate metalization of a transistor 41 comprising one of two transistors 41 and 42 of an input comparator stage 40 of the circuit. The gate electrodes of these transistors 41 and 42 are shown in FIG. 3 as thickened gate electrodes in contrast to the single lines used to represent the gate electrodes of most of the other transistors in the circuit. This is because the transistors 41 and 42 have a thick oxide layer 37 over their gate electrodes for the purposes described previously.

By utilizing the thick oxide layer over the gates of the transistors 41 and 42, the transistor comparator stage 40 presents an extremely high input impedance to the signals applied over the lead 14 to the gate of the transistor 41 and to the gate of the reference transistor 42 of the comparator 40. By using the relative oxide thickness dimensions which have been described above in conjunction with FIG. 2, this input impedance has exhibited less than one picoamp leakage at 10 volts. Thus, the desired characteristics of this circuit as a direct interface with the output of an ionization type of smoke detector 12 are realized.

The high input impedance is obtained at the sacrifice of some gain of the stage 40, but any such disadvantages are more than offset by the advantages realized through the use of the thick gate oxide. Primary among these advantages are the elimination of any necessity for buffer stages between the CMOS integrated circuit 16 and the detector 12; so that the number of circuit components can be reduced, while realizing the advantages inherent with the utilization of an integrated circuit to interface between the detector 12 and the horn 21. Also, since the gate oxide layers 34 over the majority of the devices in the CMOS integrated circuit 16 are of conventional thickness, the normal high current gain per unit area of these conventional devices is still realized. In addition to providing a high input impedance as described, the thick gate oxide layer 37 on the transistors 41 and 42 of the input stage comparator 40 also results in excellent static input protection for the integrated circuit chip 16.

Much of the circuit shown in FIG. 3 is of standard CMOS technology, so a detailed explanation of the various devices connected as resistors and those connected as switching amplifiers need not be entered into. It should be noted, however, that the provision of the reference voltage to the gate of the transistor 42 is obtained from a divider consisting of two series connected n channel devices 45 and 46 connected across the power supply and operating as voltage divider resistors. The common tap between these devices 45 and 46 then constitutes the reference voltage. In order to maintain this reference voltage constant irrespective of variations in the source voltage (i.e. independent of "body effects"), the p+ isolation ring 31 which is formed around the p— well 28 (FIG. 2) in which the devices 45 and 46 are formed, is electrically interconnected to their sources, as shown in FIG. 2 by the interconnection metalization 39. By doing this, the threshold voltage is rendered constant with respect to the source voltage, since as the source voltage varies the threshold voltage varies with it.

The bonding pad "IC REF" may be employed as an option to permit external adjustment of this reference if desired. Ordinarily, however, there is no need for such an external adjustment since the devices 45 and 46 provide the necessary reference internally on the chip. In order to similarly stabilize the input comparator stage 40, the n channel transistors 41 and 42 also have their sources electrically connected to the p+ isolation ring 31 (FIG. 2) which is formed around the p— well 28 in which these transistors are diffused to stabilize the stage 40 in a manner similar to the stabilization of the transistors 45 and 46.

The comparator 40 operates in a known manner to produce an output signal over a lead 44 to activate an alarm switch in the form of a p channel transistor 48 which is connected between the V+ supply and ground through an n channel resistor device 50. The junction between the transistor 48 and the n channel resistor 50 is connected to the input of a CMOS switch 51 comprising transistors 53 and 54 which produces an output alarm signal on the lead 52. This signal is applied to another CMOS switch comprised of a p channel transistor 55 and an n channel transistor 56 to turn on the transistor 55 and to turn off the transistor 56.

The transistor 55 is one of three transistors 55, 65 and 95 connected in parallel to the gate of an output amplifier driver transistor 58, which is rendered conductive whenever the transistor 55, or one of the other transistors in parallel with it, is rendered conductive to apply the V+ potential to the gate of transistor 58. When the transistor 58 conducts, it draws approximately 0.5 amps of current which is supplied to the "HORN" bonding pad to which the lead 20 (FIG. 1) is connected. This high current is sufficient to operate the inductive and resistive load of the mechanical horn which is employed as the output of some smoke detector circuits.

Thus, whenever the smoke detector 12 produces an output indicative of an alarm condition to the "IC IN" bonding pad connected to the gate of the transistor 41, the transistor 58 is rendered conductive to sound the alarm. Whenever the alarm condition ceases to exist, the comparator circuit 40 reverts back to its original state; and the transistor 58 is rendered non-conductive; turning off the audible or visual alarm connected to the "HORN" output bonding pad of the integrated circuit chip 16.

The circuit described thus far constitutes the basic circuit operation interfacing between the detector 12 and the output used to indicate the alarm condition. It is desirable, however, to incorporate other features into the chip; so that the versatility of the system can be substantially expanded.

A substantial advantage is achieved by having the capability of interconnecting together, on a common bus, more than one circuit of the type which has been described above; so that any one of the interconnected circuits can sound the alarms which are normally controlled only individually by such circuits. Such an installation is useful in hotels, condominiums, apartment buildings and the like, where individual sensing units are used in each different apartment; but where it is desirable to alarm the entire building if an alarm condition exists in any one unit in that building.

To accomplish this, an additional alarm buffer transistor 60 is connected between the V+ supply and an "I/O" output bonding pad. The gate of the transistor 60 is driven in parallel with the gate of the transistor 55 to cause it to be rendered conductive to apply a V+ voltage to the I/O output lead whenever an alarm condition is sensed by the unit shown in FIG. 3. Similar units are connected by similar transistors 60 to the common I/O output lead. With the circuit shown in FIG. 3 up to 20 circuits have been interconnected to a common I/O bus.

In order to cause the alarm associated with a given sensing circuit to be activated in response to any signal from any unit connected to the I/O lead, a n channel transistor switch 61 (also having a thick gate oxide layer 37 to cause it to have a high threshold value) is connected between a pair of MOS resistors 63 and 64 across the power supply. Diodes 61A and 61B protect the gate of transistor 61 by clamping the level of the voltage appearing thereon. The gate of the transistor 61 is connected to the I/O common bus bonding pad to respond to signals appearing on that bonding pad irrespective of whether those signals are initiated by the alarm circuit in the same integrated circuit chip in which the transistor 61 appears or by some other alarm circuit supplying signals to the bus connected to the I/O bonding pad. The output of the switching transistor 61 is applied to a CMOS transistor switching gates 65 66 in which the p channel transistor 65 is connected in parallel with the transistor 55, and the n channel transistor 66 is connected in series with the transistor 56. Whenever an alarm condition on the I/O common bus is detected by the transistor 61, it causes the transistor 65 to be rendered conductive and the transistor 66 to be rendered non-conductive. Since the output of the transistor 65 is connected in parallel with the transistor 55, the output current driver transistor 58 is rendered conductive in the same manner described previously to sound the alarm associated with the circuit of FIG. 3. This is done for all of the alarm circuits which are connected in common to the I/O bus.

Since the circuit shown in FIG. 3 typically is run from a battery supply, such as the battery 10 shown in FIG. 1, it is desirable, and in many cases essential, that the condition of the battery 10 be monitored continuously to provide a warning to the users of the system whenever the voltage of the battery drops below a safe threshold; so that the battery either can be re-charged or replaced. This is accomplished by the circuit shown in the upper right hand corner of FIG. 3.

The reference for determining the safe voltage of the battery is established by a zener diode 68 formed on the chip and connected in series between the V+ voltage terminal and ground through a transistor 69, operated as a current source, and a clock switch transistor 70. For the time being, ignore the effects of the clock switch transistor 70; so that the zener diode 68 produces a reference voltage at the terminal 72 which in turn is applied to one side of a conventional comparator circuit 73. The voltage input being monitored and supplied to the other side of the comparator circuit 73 is obtained from a voltage divider consisting of MOS resistors 74, 75 and 76 connected in series with another switching transistor 78 between the V+ power supply and ground. In addition, a switching transistor 80 is connected between the V+ supply line and both the comparator 73 and the upper one of the resistors 74.

For the present, ignore the operation of the switching transistors 78 and 80 and assume that they are conductive. Under these conditions, as the V+ battery voltage drops closer toward ground (which is the natural condition for an aging battery) a point finally is reached where an output is produced from the comparator circuit 73 over a lead 82 to render conductive a transistor switch 83. This latter switch in turn drives a CMOS switch 85 to produce a "LOW VOLTAGE WARNING" output on a lead 86. This output is applied to a driving circuit 90, the output of which is connected to a CMOS switch consisting of a p channel transistor 95 and a n channel transistor 96. The transistor 95 is connected in parallel with the transistors 55 and 65, and the transistor 96 is in series with the transistors 56 and 66. Whenever the transistor 95 is rendered conductive, it causes the output current driver transistor 58 to be rendered conductive to sound the alarm connected to the "HORN" output.

Obviously it is not desirable to sound the alarm in the same manner for a weak battery as for a condition such as detection of a fire or heavy smoke which is the primary purpose of the alarm. In addition, it is not necessary to continuously monitor the battery condition since any decrease in the voltage of the battery generally takes place very slowly over a long period of time (that is, one year or so). As a consequence, an additional circuit in the form of a clock pulse generating circuit 100 is fabricated on the chip. The purpose of this circuit is to produce periodic clock pulses to cause the low voltage sensing circuit to operate only during very brief intervals spaced apart by substantial periods of time. The details for fabricating a clock circuit in CMOS technology are well known, so that those details have not been shown in FIG. 3.

For the purpose of the circuit shown in FIG. 3, clock pulses are produced on the two output leads 102 and 103 approximately every 40 seconds and each pulse has a duration of 20 milliseconds. The pulses on the lead 102 are the inverse of the pulses on the lead 103. An examination of the transistors in FIG. 3 to which these clock pulses are connected clearly shows that the circuit 90 and the comparator circuit 73, as well as the zener reference divider circuit 68, 69 and the monitoring voltage divider circuits 74, 75 and 76 are only rendered operative during the brief time interval of each of the clock pulses. The result of this is that very little current drain takes place as a result of operation of the low voltage monitoring circuit during its operation.

If a low voltage condition is sensed, the horn or other warning device connected to the output of the current driver transistor 58 is only operated at momentary, periodic intervals corresponding to the clock rate and duration of the clock pulses. As a consequence, the intermittent operation of the alarm may be easily distinguished from the continuous operation when a true alarm condition exists, so that the system user knows that a low voltage condition is present rather than a full alarm condition. Also, the actuation of the alarm which is established in response to a low voltage condition is not applied over the lead 52; so that it only produces a local indication. The other devices which are connected to the I/O bonding pad on the common I/O bus are not activated in response to the low voltage condition associated with any one particular circuit.

A bonding pad labelled "L.V.REF" has been shown connected into the divider string comprised of the resistors 74, 75 and 76, but normally the internal bias provided by these resistors is sufficient to establish the proper threshold for activating the low voltage alarm. The bonding pad, however, has been provided in the event a user desires a threshold value for operating the comparator 73 which differs from the preset one established by the resistor formed on the chip.

The operating level for various current sources used at different points in the circuit, such as the current sources for the comparators 40 and 73, the current source 50 and the current source 69, is supplied from a reference voltage obtained from a pair of complementary devices 105 and 106 connected between the V+ voltage supply terminal and ground (shown in the lower left hand corner in FIG. 3).

Another feature of the circuit shown in FIG. 3, which is incorporated into the integrated circuit chip itself, is an output drive for the LED diode 23 (see FIG. 1). This drive is obtained from one or the other of two different inputs provided by a pair of switching n channel transistors 107 and 108. The transistor 107 is periodically pulsed into conduction by the clock pulses obtained on the output lead 103 from the clock circuit 100. Each time one of these pulses appears, the LED 23 connected to the "LED" bonding pad on the chip 16 is rendered operative; so that a pulsating or blinking light flashing once every 40 seconds indicates to the circuit user that the system is functioning. The other input to the LED bonding pad is through the transistor 108, and this transistor is rendered conductive (circuit connection not shown) in response to the alarm condition produced on the input gates of the complimentary switch 51. Thus, whenever an alarm condition is sensed by the comparator 40, the transistor 108 is rendered conductive; and the LED 23 connected to the bonding pad controlled by this transistor is turned on and remains on so long as the alarm condition persists.

While the circuit which has been described in conjunction with FIG. 3 adequately operates to perform the interface between the smoke detector device 12 and the output alarm in the form of the horn 21 or other output device, certain modifications can be made to the circuit of FIG. 3 to enhance various parts of its operating characteristics.

Figure 4:
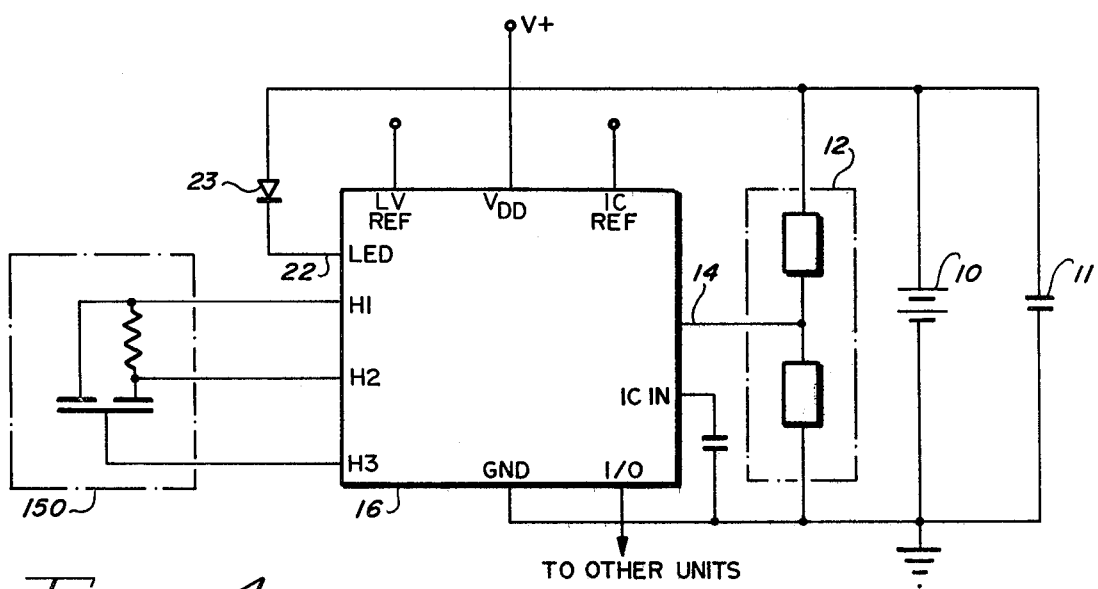
FIGS. 4 and 5 are detailed circuit diagrams showing modifications which may be made to different parts of the circuit shown in FIGS. 1 and 3.

In conjunction with the circuit of FIG. 1, the output of the integrated circuit CMOS chip 16 is shown as driving what has been termed as a "mechanical" horn of conventional configuration. Piezoelectric horns however also can be driven by devices of this type, and such piezoelectric horns are becoming increasingly popular for smoke detector output devices. In order to utilize a piezoelectric horn, the output configuration of the CMOS circuit 16 must be modified as shown in FIG. 4. Instead of a single output as shown in FIG. 1 and in the circuit of FIG. 3, it is necessary to provide three related outputs, H1, H2, and H3. These outputs then in turn are coupled with the piezoelectric horn 150 illustrated in dotted lines in FIG. 4.

The operation of piezoelectric horns is well known. Once they are triggered into oscillation they remain in a self-oscillating mode of operation. The schematic representation shown within the block 150 of FIG. 4 is a typical representation, and the outputs supplied by the circuit 16 over the leads designated H2 and H3 comprise alternating out of phase outputs which stress the piezoelectric crystal first in one direction and then the other to achieve the desired operating characteristics. A feed back loop for the oscillator is completed by an output received from the piezoelectric horn 150 and applied to the lead or bonding pad identified as H1 in FIG. 4.

Figure 5:
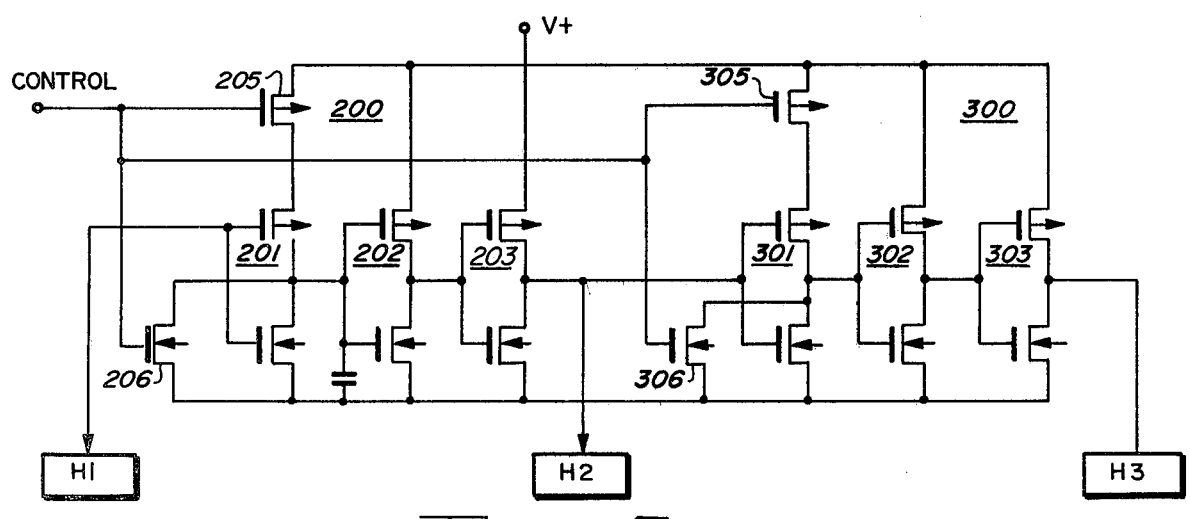

Reference now should be made to FIG. 5 which illustrates a preferred form of output driver for a piezoelectric horn 150. The circuit of FIG. 5 when a piezoelectric horn is selected as the system output is substituted for the single transistor 58 shown in FIG. 3. While a much larger number of transistors are used in the circuit of FIG. 5, the total chip area which is consumed by those transistors is approximately the same as the area which is consumed by the single transistor 58; because of the large current handling requirements which are met by the transistor 58 in the circuit of FIG. 3.

Normally a piezoelectric crystal is driven by a pair of cascaded inverter stages with the input of the first stage being the H1 input, the output of the first stage corresponding to the H2 output and the output of the second stage corresponding to the H3 output. The problem with employing such a circuit configuration in a simple CMOS switching system, where each of these inverters would include one CMOS switching gate, is that the signal applied to the input H1 from the piezoelectric device is essentially a sine wave signal. As a consequence, during a large portion of the operating time of such a system, both transistors of the CMOS complementary switch are simultaneously conductive. This results in the dissipation of large amounts of power in the chip unnecessarily. As a result, this is not an efficient circuit form for utilization in CMOS technology. Using the circuit shown in FIG. 5, however, and by properly varying the size of the transistors in the different stages, a highly efficient piezoelectric driver results. In the circuit of FIG. 5, each of the two inverters formerly used in the prior art are replaced by three cascaded inverter stages formed of CMOS complementary switches. An odd number must be employed and the number must be greater than one; so the three which are shown in two different sets, for a total of six different inverter stages, comprise a minimum number for achieving the results of a high current output drive with low on-chip dissipation of power. The input inverter stage 200 consists of three complementary CMOS switching stages 201, 202 and 203 cascaded directly to one another. Similarly the output stage 300 consists of three cascaded CMOS switching stages 301, 302, and 303.

The control signal which is comparable to the signal applied to the base of the transistor 58 in the circuit description of FIG. 3 is applied in parallel to two complementary CMOS control or gating switch circuits 205, 206 and 305, 306. If no alrm condition is present, the signal on the control input is such that the transistors 206 and 306 are rendered conductive and the transistors 205 and 305 are rendered non-conductive. As is apparent from an examination of FIG. 5, this disables the input stages 201 and 301 at each portion of the double inverter circuit shown in FIG. 5; so that it will not operate and the piezoelectric horn 150 is not driven. When the control signal reverses, however, to cause the transistors 205 and 305 to become conductive and the transistors 206 and 306 to become non-conductive, the circuit is enabled for operation, and the piezoelectric horn 150 is driven into its vibration mode to sound the alarm.

Since sine wave signals are applied from the piezoelectric horn 150 to the gates of the input stage 201, the undesired simultaneous current conducting characteristics of the transistors of this stage do occur. The effects of this, however, are substantially reduced by making the transistors in this stage 201, and similarly the transistors in the stage 301, very small in area; so that they conduct very low current even when both of the transistors of the stage 201, in particular, may be conductive simultaneously a good part of the time.

The inherent nature of the cascaded circuit, however, is one which squares up the waveform; so that by the time the signal reaches the gates of the third stages, 203 and 303, an essentially square wave signal is present. Thus, the output stages 203 and 303 are made to have very high chip area; so that they conduct high current, but that current is supplied to the output bonding pads H2 and H3 where it is desired for driving the piezoelectric horn rather than being dissipated on the chip. To accomplish this result, the area occupied by the transistors of the stages 203 and 303 is selected to be about 700 times the area of the input stages 201 and 301. Thus, it is readily apparent that even though both of the transistors of the stage 201 may be simultaneously conductive for a large portion of the cycle of operation of this system, very little wasteful power dissipation results because of the small area occupied by these transistors.

Various modifications will occur to those skilled in the art which are equivalent to the circuits and structures, which have been described above in conjunction with the drawings for the preferred embodiments of the invention, without departing from the true scope of this invention; and the illustrations which have been used are therefore to be considered simply as that, merely illustrative of the invention and not as limiting.

What is claimed, is:

1. An output driver circuit formed as an integral part of a CMOS circuit chip including, in combination:

first and second high gain CMOS circuit amplifier sets, each including three pairs of first and second complementary field effect transistors, each pair connected in series between first and second voltage supply terminals, and means connecting a common junction of the transistors of each pair, except the third pair, to the common interconnected gates of the next succeeding pair of transistors in each set;

means for applying input signals in common to the gates of the first pair of transistors of the first set, a common junction of the third pair of transistors of the first set being connected in common to the gates of the transistors of the first pair of the second set;

means for obtaining output signals from a common junction of the transistors of the third pair of transistors in said second set and the common junction of the transistors of the third pair of transistors of said first set; and control means responsive to a control signal and coupled to the first pairs of transistors in each amplifier set for disabling said first pairs when said control signal is in a first condition and for enabling said first pairs when said control signal is in a second condition.

2. The combination according to claim 1 wherein the transistors of the first pair of transistors of each of said first and second sets conduct very low values of current relative to the current conducted by the third pair of transistors in each set.

3. The combination according to claim 2 wherein chip area of the transistors of the third pair of each of said sets is several hundred times larger than chip area of the first pair of transistors in each of said first and second sets.

* * * * *